United States Patent [19]

Yoshikawa et al.

[11] Patent Number: 4,948,753
[45] Date of Patent: Aug. 14, 1990

[54] METHOD OF PRODUCING STRIPE-STRUCTURE SEMICONDUCTOR LASER

[75] Inventors: Akio Yoshikawa, Takatsuki; Takashi Sugino, Kusatsu, both of Japan

[73] Assignee: Matsushita Electric Industrial Co., Ltd., Osaka, Japan

[21] Appl. No.: 114,065

[22] Filed: Oct. 29, 1987

Related U.S. Application Data

[62] Division of Ser. No. 715,392, Mar. 25, 1985, Pat. No. 4,719,633.

[30] Foreign Application Priority Data

| Mar. 27, 1984 | [JP] | Japan | 59-58712 |
| Jul. 5, 1984 | [JP] | Japan | 59-137932 |
| Aug. 8, 1984 | [JP] | Japan | 59-166172 |

[51] Int. Cl.$^5$ ............... H01L 21/20; H01L 21/203
[52] U.S. Cl. ................ 437/129; 148/DIG. 95; 148/DIG. 110; 357/17; 437/81; 437/133; 437/947; 437/987
[58] Field of Search ........... 148/DIG. 50, 56, 65, 148/66, 72, 84, 95, 101, 110, 169, 33.2, 33.4; 156/610–614; 357/16, 17, 55; 372/46, 48, 45; 437/22, 90, 81, 104, 107, 121, 126, 129, 947, 981, 987

[56] References Cited

U.S. PATENT DOCUMENTS

| 4,366,568 | 12/1982 | Shimizu et al. | 372/46 |
| 4,404,678 | 9/1983 | Aiki et al. | 372/48 |
| 4,429,395 | 1/1984 | Olsen et al. | 427/129 |
| 4,506,366 | 3/1985 | Chinone et al. | 357/17 |
| 4,569,721 | 2/1986 | Hayakawa et al. | 437/89 |
| 4,637,122 | 1/1987 | Carney et al. | 437/129 |
| 4,647,953 | 3/1987 | Okajima et al. | 357/17 |
| 4,648,940 | 3/1987 | Menigaux et al. | 437/90 |

FOREIGN PATENT DOCUMENTS

| 0043428 | 3/1982 | Japan | 437/129 |
| 0139982 | 8/1982 | Japan | 437/129 |
| 0139986 | 8/1982 | Japan | 437/129 |
| 0010884 | 1/1983 | Japan | 437/129 |
| 0086789 | 5/1983 | Japan | 437/129 |
| 0020594 | 2/1985 | Japan | 437/129 |
| 0021586 | 2/1985 | Japan | 437/129 |
| 0068685 | 4/1985 | Japan | 437/129 |
| 0077482 | 5/1985 | Japan | 437/129 |

OTHER PUBLICATIONS

Mito et al., "In GaAsP Planar Buried Heterostructure Laser Diode...", Electronics Letters, Jan. 7, 1982, vol. 18, No. 1, pp. 2-3.

Primary Examiner—Brian E. Hearn
Assistant Examiner—William Bunch
Attorney, Agent, or Firm—Spencer & Frank

[57] ABSTRACT

A semiconductor laser and a method of producing the same wherein the semiconductor laser is produced by forming a stripe-shaped projection on the surface of a semiconductor substrate, and forming multilayered thin films with a double heterostructure including an active layer on said semiconductor substrate by using the metal organic chemical vapor phase epitaxial growth method or the molecular beam epitaxial growth method. Thus, a buried stripe-structure semiconductor laser can be produced by a sequence of crystal growth processes.

2 Claims, 5 Drawing Sheets

METHOD OF PRODUCING STRIPE-STRUCTURE SEMICONDUCTOR LASER

This is a Division of application Ser. No. 06/715,392 filed March 25th, 1985 U.S. Pat. No. 4,719,633.

BACKGROUND OF THE INVENTION

This invention relates to a semiconductor laser and a method of producing the same which has recently rapidly extended its application to light sources for various types of electronic equipment and optical apparatus and is now greatly in demand.

One of the important functions of a semiconductor laser which is required when it is used as a coherent light source for electronic equipment or optical apparatus is oscillation at a single spot, or single transversal mode oscillation. To realize this, it is necessary to suppress the spread of laser light and confine the light by a concentration current flowing through the laser element near the active region in which the laser light propagates. This type of semiconductor laser is normally called the stripe-type semiconductor laser.

A relatively simple method for the stripe type is to only restrict current to be narrow. The laser according to this method needs a high threshold value for realization of the single transversal mode oscillation. The stripe type which can oscillate at the lowest threshold is a buried stripe type semiconductor laser (normally called the BH laser). The production of this type of laser, however, requires that the crystal growth process be performed twice whereas with other lasers this process need normally be performed only once, that is, it is necessary that after the multilayered films including an active layer are grown the buried region be removed and then a buried layer be again grown. In addition, it is somewhat technically difficult to produce this laser.

It is an object of this invention to provide a method of producing a semiconductor laser in which the buried-stripe structure that is necessary to oscillate in a single transversal mode at a low threshold value can be produced by a single crystal growth process.

SUMMARY OF THE INVENTION

According to this invention, there is provided a method of producing a semiconductor laser comprising the steps of forming multilayered thin films of double heterostructure including an active layer on a semiconductor substrate having a stripe-shaped projection by the metal organic chemical vapor phase epitaxial growth method or molecular beam epitaxial growth method, and doping an impurity material of a conductivity type opposite to that of the semiconductor substrate into the top layer of the multilayered thin films formed on the stripe-shaped projection.

Therefore, even on both sides of the stripe-shaped projection, there are formed the same multilayered thin films of up to at least the thin film just on the active layer at those on the stripe-shaped projection. That is, it is possible to easily produce a buried-stripe structure semiconductor laser capable of restricting current to be narrow in the active layer on the stripe-shaped projection, by a single crystal growth process.

BRIEF DESCRIPTION OF THE DRAWINGS

The present invention will be apparent from the following detailed description taken in conjunction with the accompanying drawings, in which.

DESCRIPTION OF THE PREFERRED EMBODIMENTS

One embodiment of a method of producing a semiconductor laser of the invention will be described in detail.

Figure 1:
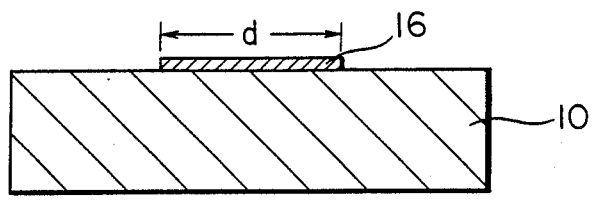
FIGS. 1 to 3 are flow diagrams of a first embodiment of a method of producing a semiconductor laser according to this invention.
Figure 2:
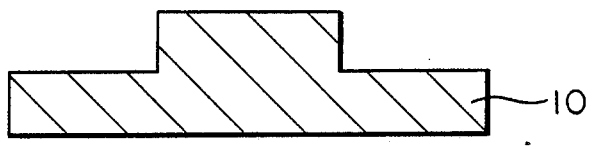

For example, an n-type GaAs substrate is used for a conductive substrate. A photoresist layer 16 with a width d is formed on the (100) plane of an n-type GaAs substrate 10 as shown in FIG. 1, and this substrate 10 is chemically etched to have recesses and a projection in parallel with the direction $<011>$ except the area masked by the photoresist layer 16, in order to have a stripe-shaped projection 5 $\mu$m wide and 1.5 $\mu$m high as shown in FIG. 2.

Then, an n-type $Ga_{1-x}Al_xAs$ clad layer 11, 1.5 $\mu$m thick; an undoped $Ga_{1-y}Al_yAs$ ($0 \leq y < x$) active layer 12, 0.08 $\mu$m thick; a p-type $Ga_{1-x}Al_xAs$ clad layer 13, 1.2 $\mu$m thick; and then an n-type GaAs cap layer 14, 2 $\mu$m thick are sequentially grown over the substrate by the metal organic chemical vapor deposition method (normally, MOCVD method). The conditions for the crystal growth are, for example, as follows: the growth rate is 2 $\mu$m/hour; the growth temperature is 770° C.; the flow rate of all gases is 5 l/min.; and the mol ratio of V group element to III-group element is 40.

Figure 3:
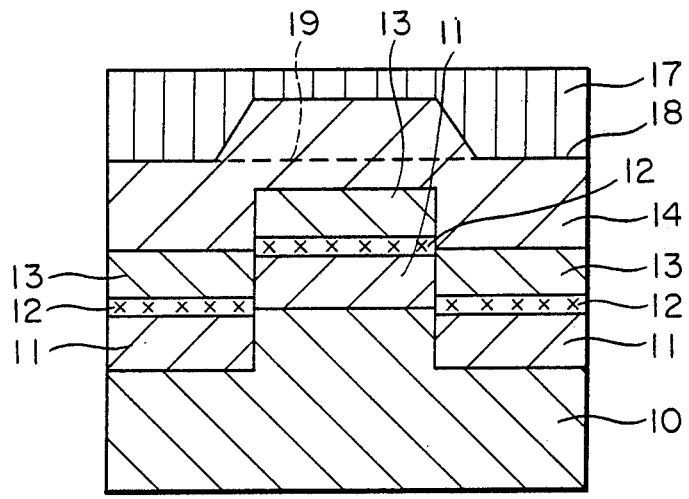

As illustrated in FIG. 3, the epitaxial growth of up to the p-type $Ga_{1-x}Al_xAs$ clad layer 13 on the projection of the substrate is made independently of that on the other areas. Since the provision of the stripe-shaped projection in the $<011>$ direction on the (100) plane prevents continuous growth of the material along the substrate surface so as to maintain the shape of the substrate, the epitaxial growth of the materials is accompanied by no effect of diffusion and so on in the direction parallel with the substrate surface.

Figure 4:
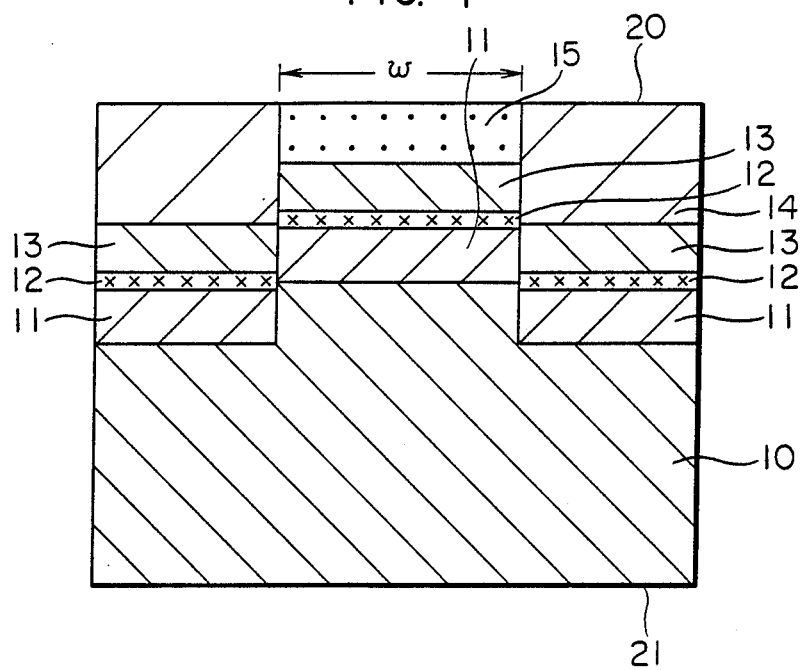
FIG. 4 is a cross-sectional diagram of a semiconductor laser produced according to the method of the first embodiment of the invention.

After the crystal growth, the surface of the crystal-grown substrate is rinsed and a photoresist 17 is coated over the substrate, which is then rotated at 5000 rpm. As a result, the photoresist film 17 is thin on the projection of the substrate but thick on the other area thereof as shown in FIG. 3. The photoresist film 17 only on the projection is removed by an optimum exposure condition and the projection of the n-type GaAs cap layer is etched away. Consequently, planes 18 and 19 shown in FIG. 3 are exposed to the external as the surface of the substrate, or the substrate becomes flat. In addition, zinc Zn is diffused into a stripe-shaped area of a width w of the substrate and as a result a semiconductor laser structure is produced as shown in FIG. 4. Then, electrodes are attached to surfaces 20 and 21 of the laser structure to be in ohmic contact therewith. When a current is injected through the electrodes, the current is restricted to be narrow in the upper and lower portions by the projection of n-type GaAs substrate 10 and the p-type GaAs region 15 formed by diffusion, resulting in single-mode oscillation at 30 mA, threshold current value.

A second embodiment of the invention will be described below.

Figure 5:
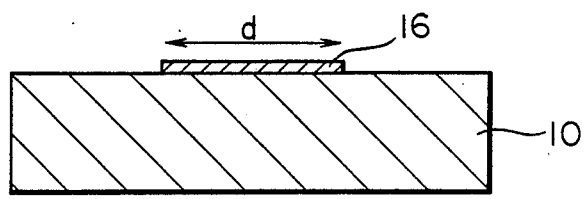
FIGS. 5 to 7 are flow diagrams of a second embodiment of the invention.
Figure 6:
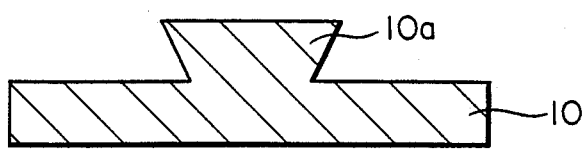

The photoresist layer of the width d is formed on the (100) plane of the n-type GaAs substrate 10 as shown in FIG. 5 and the substrate 10 is chemically etched to have recesses and a projection in parallel with the <011> direction, or a stripe-shaped, reverse mesa shaped projection 10a of 5 μm wide and 1.5 μm high as shown in FIG. 6. Then, the n-type $Ga_{1-x}Al_xAs$ clad layer 11, 1.5 μm thick; the undoped $Ga_{1-y}Al_yAs$ active layer 12 ($0 \leq y < x$), 0.08 μm thick; the p-type $Ga_{1-x}Al_xAs$ clad layer 13, 1.2 μm thick; and the n-type cap layer 14, 2 μm thick are sequentially grown by the metal organic chemical vapor deposition method (normally, the MOCVD method). The conditions for the crystal growth are, for example, as follows: the growth rate is 2 μm/hour the growth temperature is 770° C.; the flow rate of all gases is 5 l/min.; and the mol ratio of V-group element to III-group element is 40. The epitaxial growth of up to the p-type $Ga_{1-x}Al_xAs$ clad layer 13 on the projection of the substrate is made independently of that of the other areas. Since the provision of the stripe-shaped projection in the <011> direction on the (100) plane prevents continuous growth of the material along the substrate surface so as to maintain the shape of the substrate, the epitaxial growth of the materials is accompanied by no effect of diffusion and so on in the direction parallel with the substrate surface.

Figure 7:
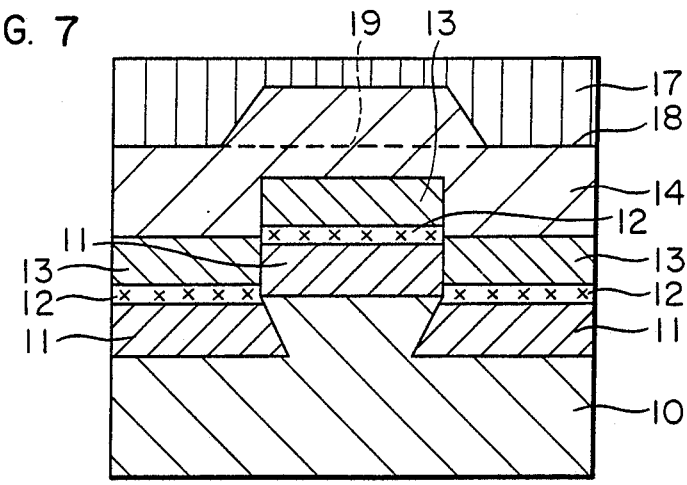
Figure 8:
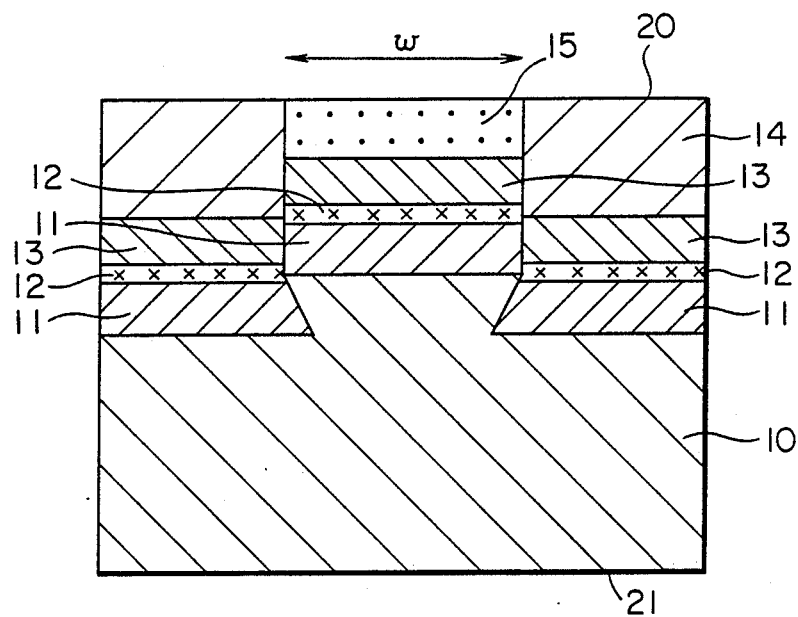
FIG. 8 is a cross-sectional diagram of a semiconductor laser produced according to the second embodiment of this invention.
Figure 9:
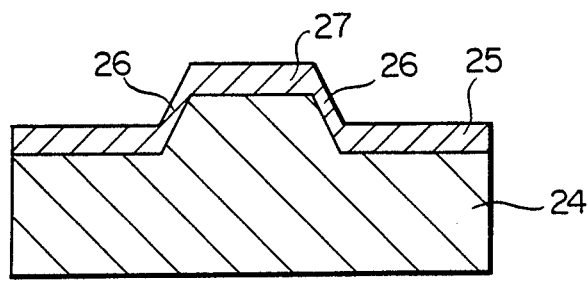
FIG. 9 shows the crystal growth on a semiconductor substrate having a forward mesa-shaped projection.

After the crystal growth, the surface of the crystal-grown substrate is rinsed and the photoresist 17 is coated over the substrate, which is then rotated at 5000 rpm. As a result, the photoresist film 17 is made thin on the projection of the substrate but thick on the other area thereof as shown in FIG. 7. The photoresist film 17 only on the projection is removed by an optimum exposure condition and the projection of the n-type GaAs cap layer is etched away. Consequently, the planes 18 and 19 shown in FIG. 7 are exposed to the external, or the substrate becomes flat. In addition, zinc Zn is diffused into the substrate to form the stripe-shaped p-type GaAs region 15 of width w. As a result, a semiconductor laser structure is produced as shown in FIG. 8. Then, electrodes are attached to the surfaces 20 and 21 of the laser structure to be in ohmic contact therewith. When a current is injected through the electrodes, the current is restricted to be narrow in the upper and lower portions by the projection of the n-type GaAs substrate 10 and the p-type GaAs region 15 formed by diffusion, resulting in single transversal mode oscillation at 30 mA, threshold current value. On the epitaxial growth on the stripe-shaped, forward mesa-shaped projection, as shown in FIG. 9, epitaxially grown layers 25 and 27 are not grown independently of each other after reaching a certain thickness of growth, that is, an epitaxially grown layer 26 is formed between the layers 25 and 27 and these epitaxially grown layers 25, 26 and 27 are formed as the same epitaxially grown layer.

Therefore, even if a semiconductor laser structure of this invention is tried to be produced, the p-n junctions on both sides of the projection do not serve to block current. Consequently, low-threshold current operation cannot be realized and also laser oscillation cannot be achieved.

A third embodiment of this invention will be described.

Figure 10:
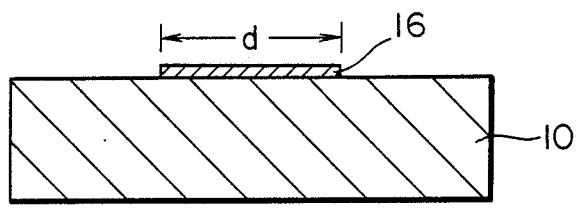
FIGS. 10 to 12 are flow diagrams of a third embodiment of the invention.
Figure 11:
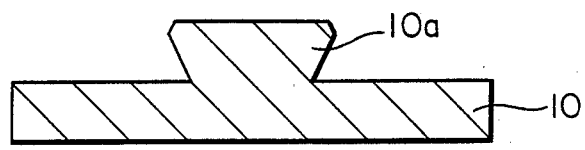

The photoresist film 16 of width d is formed on the (100) plane of the n-type GaAs substrate 10 as a mask for mesa etching as shown in FIG. 10. The substrate 10 is then chemically etched to have recesses and a projection in parallel with the <011> direction. As result, as shown in FIG. 11, the stripe-shaped projection 10a 5 μm width and 1.5 μm high is formed to have such a relation that the top flat surface and the adjacent side surfaces make obtuse angles and that at least one side surface of the root continuous to the adjacent side surfaces and the top flat surface make an angle smaller than 90°. The difference between the mesa shapes shown in FIGS. 6, 11 and 14 is attributable to the difference in chemical etchants employed.

Figure 12:
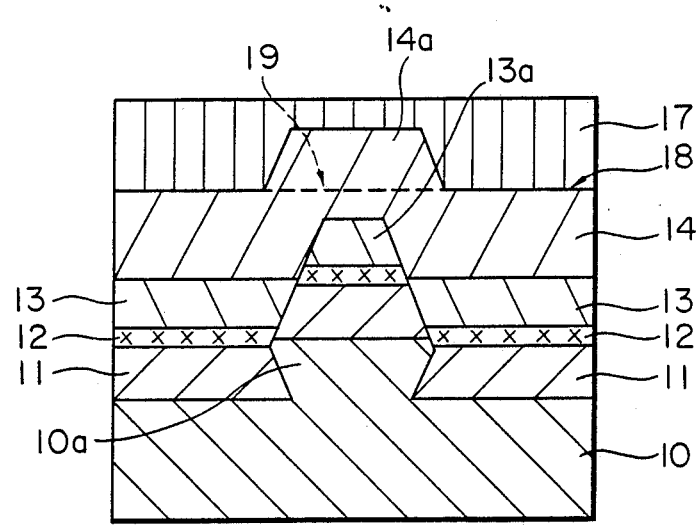

Then, the n-type $Ga_{1-x}Al_xAs$ clad layer 11, 1.5 μm thick; the undoped $Ga_{1-y}Al_yAs$ ($0 \leq y < x$) active layer 12, 0.08 μm thick; the p-type $Ga_{1-x}Al_xAs$ clad layer 13, 1.2 μm thick; and the n-type GaAs cap layer 14, 2 μm thick are sequentially grown by the metal organic chemical vapor deposition method (normally, the MOCVD method) as shown in FIG. 12. The conditions for the epitaxial growth are, for example, as follows: the growth rate is 2 μm/hour; the growth temperature is 770° C.; the flow rate of all gases is 5 l/min.; and the ratio of V-group element to III-group element is 40. The epitaxial growth of up to the p-type $Ga_{1-x}Al_xAs$ clad 13 on the projection 10a of the substrate is made independently of that of the other areas. Since the provision of the stripe-shaped projections in the <011> direction on the (100) plane prevents continuous growth of the material along the substrate surface so as to maintain the shape of the substrate, the epitaxial growth of the materials is accompanied by no effect of d and so on in the direction parallel with the surface as shown in FIG. 12.

Figure 13:
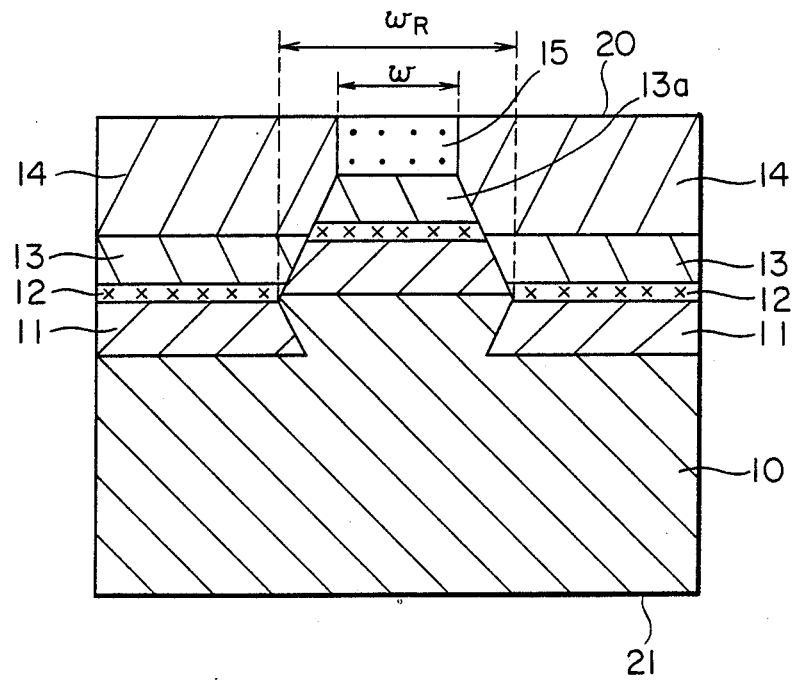
FIG. 13 is a cross-sectional diagram of a semiconductor laser produced according to the third embodiment of the invention.

After the crystal growth, the surface of the crystal grown substrate is rinsed and the photoresist 17 is coated over the substrate, which is then rotated at 5000 rpm. As a result, the photoresist film 17 is thin on the projection 14a of the n type GaAs cap layer 14 but thick on the other area as shown in FIG. 12. The photoresist film 17 only on the projection 14 is removed by an optimum exposure condition and the projection 14a is etched away. Consequently, the planes 18 and 19 shown in FIG. 12 are exposed to the external, or the top of the n-type GaAs cap layer 14 has a flat surface. In addition, zinc Zn is diffused into a stripe-shaped area of a width w of the substrate to form the stripe-shaped p-type GaAs region 15 of width w on the projection 13a of the clad layer 13 opposite to the projection 10a. As a result, a semiconductor laser structure is produced as shown in FIG. 13. Then, electrodes are attached to the surfaces 20 and 21 of the laser structure to be in ohmic contact therewith. When a current is injected through the electrodes, the current is restricted to be narrow in the upper and lower portions by the projection 10a of the n-type GaAs substrate 10 and the p-type GaAs region 15 formed by diffusion. Also, the stripe width w of the p-type GaAs region 15 becomes smaller than the width $w_R$ of the top of the projection 10a on the substrate 10 as shown in FIG. 13, and thus the current is restricted to be narrower. This is probably because the crystal growth is made on the top of the projection shaped in forward mesa and hence a kind of facet like (111) plane appears on the surface of the grown crystal on the sides of the projection. Consequently, the semiconductor laser oscillates in a single transversal mode at a threshold current of 25 mA.

Figure 14:
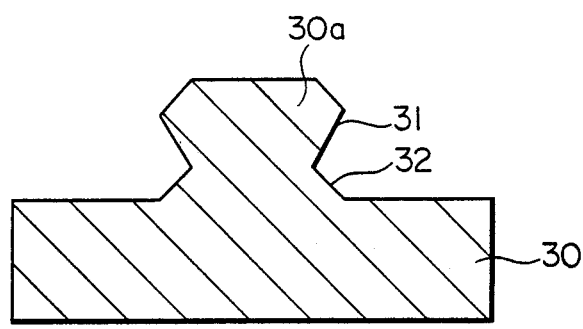
FIG. 14 is a cross-sectional diagram of a substrate used in a fourth embodiment of the invention.

FIG. 14 is a cross-sectional diagram of the substrate used in a fourth embodiment. A projection 30a of an n-type GaAs substrate 30 is so shaped that the skirt portion of a root-side surface 31 is formed as an outwardly expanding slope 32. Crystal growth was tried on this substrate and the result was the same as in the above embodiments.

According to these embodiments, the buried type laser can be produced by a single crystal growth process although it needed two crystal growth operations in the prior art.

Moreover, even in the case of forming first an n-type GaAs buffer layer and then an n-type $Ga_{1-x}Al_xAs$ clad layer on an n-type GaAs substrate, the result was the same as in the above embodiments.

While in the above embodiments GaAs-based and GaAlAs-based semiconductor lasers were described, this invention can be applied to semiconductor lasers made of compound semiconductor materials including InP and other multi element compound semiconductor crystal materials.

Moreover, the conductive substrate to be used may be a p-type substrate and the crystal growth method to be used may be another crystal growth method, for example, the molecular beam epitaxial growth method (MBE method).

Thus, according to this invention, it is possible to produce a buried type laser having a narrow-stripe structure active layer and oscillating in a single transversal mode at a low threshold current, by a single crystal growth process.

We claim:

1. A method of producing a semiconductor laser, comprising the steps of:

forming a stripe-shaped projection along a <011> direction on a (100) surface of a semiconductor substrate by chemical etching;

growing on said (100) surface of said semiconductor substrate and on said projection, multilayered thin films with a buried double heterostructure including an active layer, the top layer of which has the same conductivity as that of said semiconductor substrate, by using a metal organic chemical vapor phase epitaxial growth method or a molecular beam epitaxial growth method; and doping an impurity of the conductivity type opposite to that of said semiconductor substrate into the top layer of said multilayered thin films formed on said stripe-shaped projection.

2. The method of producing a semiconductor laser according to claim 1, wherein said stripe-shaped projection has a reverse mesa shape.

* * * * *